(12) United States Patent
Zou et al.

(10) Patent No.: US 10,756,509 B2
(45) Date of Patent: Aug. 25, 2020

(54) ACCURATE CURRENT MIRROR CIRCUIT IN LOW VOLTAGE HEADROOM APPLIED TO LASER DRIVERS

(71) Applicant: AmpliPHY Technologies Limited, Hangzhou (CN)

(72) Inventors: Hehong Zou, Hangzhou (CN); Tianlin Cao, Hangzhou (CN); Jie Lou, Hangzhou (CN); Zhuoyuan Li, Hangzhou (CN)

(73) Assignee: AMPLIPHY TECHNOLOGIES LIMITED, Hangzhou (CN)

( * ) Notice: Subject to any disclaimer, the term of this patent is extended or adjusted under 35 U.S.C. 154(b) by 0 days.

(21) Appl. No.: 16/246,572

(22) Filed: Jan. 14, 2019

(65) Prior Publication Data

US 2020/0091678 A1   Mar. 19, 2020

(30) Foreign Application Priority Data

Sep. 18, 2018   (CN) .......................... 2018 1 1085780

(51) Int. Cl.
| | |
|---|---|
| *H01S 5/042* | (2006.01) |
| *G05F 1/575* | (2006.01) |
| *H01S 5/062* | (2006.01) |
| *H01S 5/068* | (2006.01) |

(52) U.S. Cl.
CPC .............. *H01S 5/042* (2013.01); *G05F 1/575* (2013.01); *H01S 5/0427* (2013.01); *H01S 5/06213* (2013.01); *H01S 5/06808* (2013.01); *H01S 5/06223* (2013.01)

(58) Field of Classification Search
CPC ...... H01S 5/042; H01S 5/0427; H01S 5/0428; H01S 5/062; H01S 5/06209; H01S 5/06213; H01S 5/06223; H01S 5/06808
See application file for complete search history.

(56) References Cited

U.S. PATENT DOCUMENTS

| | | | |
|---|---|---|---|
| 6,744,795 B2 * | 6/2004 | Magoon ............... | H04B 10/503 372/38.02 |
| 7,557,332 B2 * | 7/2009 | Elsheimer ............ | G06F 3/0312 250/205 |
| 7,940,037 B2 * | 5/2011 | Prexl .................. | H05B 33/0827 323/304 |

(Continued)

*Primary Examiner* — Tod T Van Roy
(74) *Attorney, Agent, or Firm* — Bayramoglu Law Offices LLC

(57) ABSTRACT

This invention provides an accurate current mirror circuit in a low voltage headroom applied to common-anode laser drivers, including a reference current detection unit, a tail current source unit, and a control unit. The reference current detection unit generates a bias voltage and a reference voltage according to a reference current from the reference current source; the tail current source unit receives the bias voltage and generate a mirror current accordingly; the control unit receives the reference voltage and an output voltage corresponding to the mirror current and carry out a feedback regulation to the bias voltage accordingly. In this invention, the reference voltage and the output voltage are locked at same level, and then the bias voltage is mirrored to generate the mirror current outputted to the laser, thus avoiding the problem of inaccurate current output caused by the offset of the control unit in the low voltage headroom.

5 Claims, 2 Drawing Sheets

(56) References Cited

U.S. PATENT DOCUMENTS

2003/0160636 A1\* 8/2003 Fattaruso ................ H01S 5/042
327/65
2007/0205810 A1\* 9/2007 Rees ................ H03K 17/04123
327/108

\* cited by examiner

ACCURATE CURRENT MIRROR CIRCUIT IN LOW VOLTAGE HEADROOM APPLIED TO LASER DRIVERS

CROSS-REFERENCE TO RELATED APPLICATIONS

This Non-provisional application claims priority under 35 U.S.C. § 119(a) on Patent Application No(s). 201811085780.9 filed in People's Republic of China on Sep. 18, 2018, the entire contents of which are hereby incorporated by reference.

BACKGROUND OF THE INVENTION

Field of the Invention

This invention relates to a technical field of a laser driver and, more particularly, to an accurate current mirror circuit in a low voltage headroom applied to the laser driver.

Description of the Related Art

The lasers can have two driving modes: common-anode driving and common-cathode driving. The common-anode driving mode has higher efficiency. As shown in FIG. 1, the amount of change in a current flowing through the laser D0, also known as a modulation current, is determined by a tail current source. Depending on different luminous power that needs to be transmitted, the modulation current usually varies in the range of from a few milliamps to tens or even hundreds of milliamps.

However, under the conventional supply voltage of 3.3V (2.97V~3.63V), the voltage headroom of the tail current source needs to be lower than 0.3V, which is difficult to achieve accurate modulation current due to the influence of the insufficient voltage headroom.

FIG. 2 is a current mirror circuit of a conventional tail current control method, which uses an error amplifier A0 to make the voltage drop Vn across a resistor R0 and the voltage drop Vp across resistors R1~Rm approximately equal, thereby obtaining a tail current $i_m = m \cdot i_0$. The main drawback of this method is that an offset voltage of the error amplifier has a direct influence on the accuracy of the current. Especially when $i_0$ is relative small and the voltage of Vp and Vn is very low, the error introduced by the offset voltage of the amplifier can even completely disable the current control. Therefore, it is necessary to provide an additional circuit to eliminate the offset voltage of the amplifier, which increases design complexity.

BRIEF SUMMARY OF THE INVENTION

This invention provides an accurate current mirror circuit in a low voltage headroom applied to common-anode laser drivers to solve the above-mentioned problems.

To solve the above-mentioned problems, an embodiment of this invention provides the accurate current mirror circuit in the low voltage headroom applied to the laser driver, including a reference current detection unit, a tail current source unit, and a control unit;

the reference current detection unit is coupled with a reference current source, and the reference current detection unit is configured to receive a reference current of the reference current source and generate a bias voltage and a reference voltage according to the reference current; the tail current source unit is coupled with the reference current detection unit, and the tail current source unit is configured to receive the bias voltage and generate a mirror current according to the bias voltage; and the control unit is coupled with the reference current detection unit and the tail current source unit, and the control unit is configured to receive the reference voltage and an output voltage corresponding to the mirror current and carry out a feedback regulation to the bias voltage outputted by the reference current detection unit according to the reference voltage and the output voltage corresponding to the mirror current.

As an implement way, the tail current source unit may include a plurality of tail current source modules, and each may include a feedback resistor and a n-type, p-type, n-type (NPN) bipolar junction transistor. One end of the feedback resistor may be coupled with an output end of the reference current detection unit and configured to receive the bias voltage, and the other end of the feedback resistor may be coupled with a base of the NPN bipolar junction transistor. A collector of the NPN bipolar junction transistor may be coupled with an input end of the control unit, and an emitter of the NPN bipolar junction transistor may be grounded.

As an implement way, the reference current detection unit may include a first n-channel metal oxide semiconductor (NMOS) transistor, a first NPN bipolar junction transistor, and a bias resistor. A drain of the first NMOS transistor may be coupled with the reference current source, a gate of the first NMOS transistor may be coupled with an output end of the control unit, and a source of the first NMOS transistor may be coupled with a collector of the first NPN bipolar junction transistor. A base of the first NPN bipolar junction transistor may be coupled with one end of the bias resistor, an emitter of the first NPN bipolar junction transistor may be grounded, and the other end of the bias resistor may be coupled with the tail current source unit.

As an implement way, the reference current detection unit may further include a second NMOS transistor. A drain of the second NMOS transistor may be coupled with a power supply voltage, a gate of the second NMOS transistor may be coupled with the drain of the first NMOS transistor, and a source of the second NMOS transistor may be coupled with a connection node of the reference current detection unit and the control unit.

As an implement way, the control unit may include an error amplifier, and the error amplifier may include two input ends and one output end. One of the input ends may be coupled with an output end of the tail current source unit, the other input end may be coupled with a connection node of the first NMOS transistor and the first NPN triode, and the output end may be coupled with the gate of the first NMOS transistor.

As an implement way, the reference current detection unit may include a bias resistor, the tail current source may include a plurality of feedback resistors, and the bias resistor and the feedback resistors may be of the same type.

Compared with the prior art, a beneficial effect of this invention is as follows. The bias voltage is generated through a feedback regulation of the reference voltage Vn and the output voltage Vp, and then the bias voltage is mirrored to generate the mirror current outputted to the laser, thus avoiding the problem of inaccurate current output caused by the offset of the control unit in the low voltage headroom.

Figure 1:
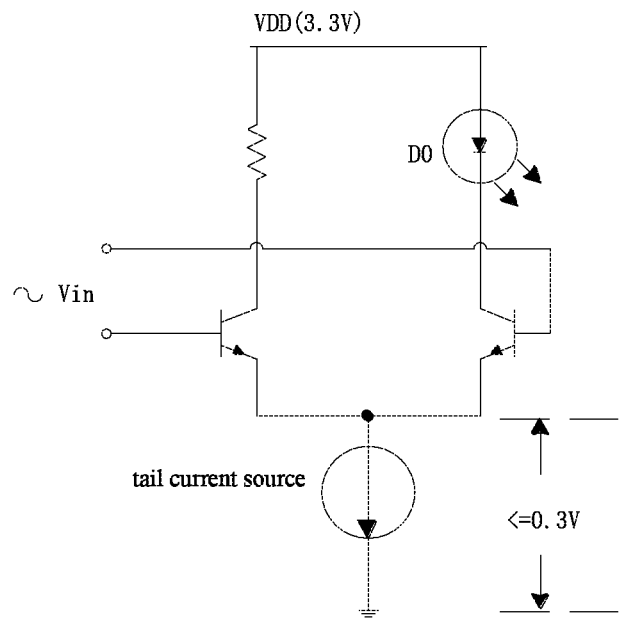
FIG. 1 is a circuit diagram of a common-anode laser driving circuit in the prior art.
Figure 2:
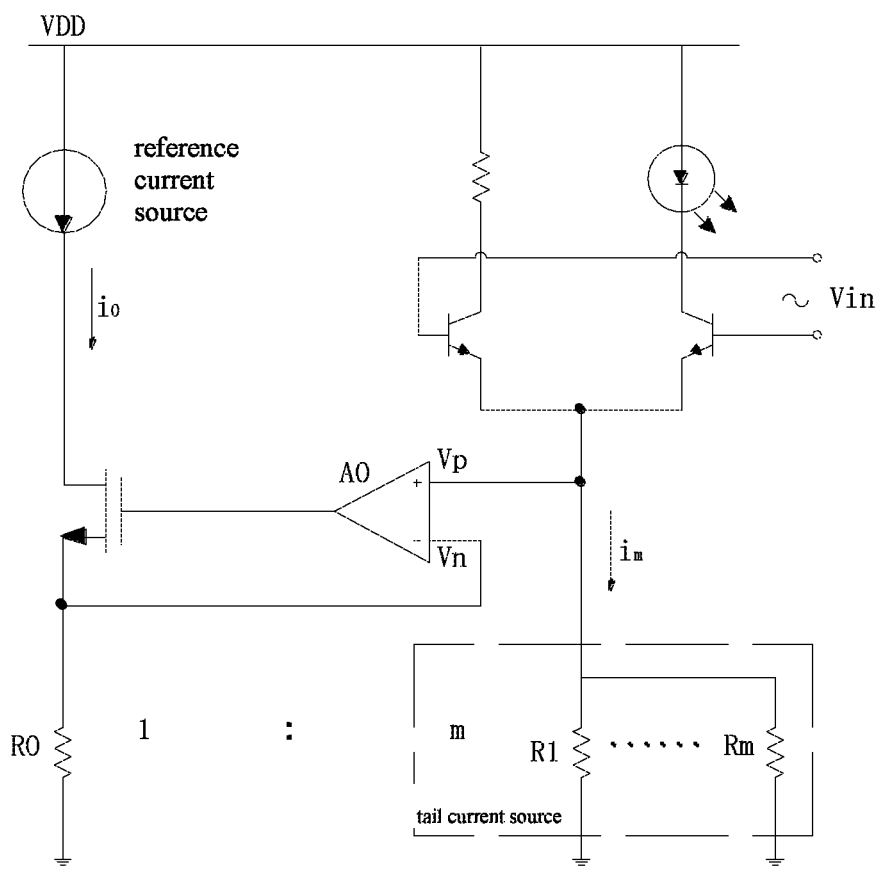
FIG. 2 is a circuit diagram of a current mirror circuit in the prior art.

Figure reference numerals: 1. reference current detection unit; 2. tail current source unit; and 3. control unit.

DETAILED DESCRIPTION OF THE INVENTION

The above and other technical features and advantages of this invention will be clearly and completely described combining with the accompanying drawings hereinafter. Apparently, the described embodiments are merely parts of the embodiments of this invention instead of all the embodiments.

Figure 3:
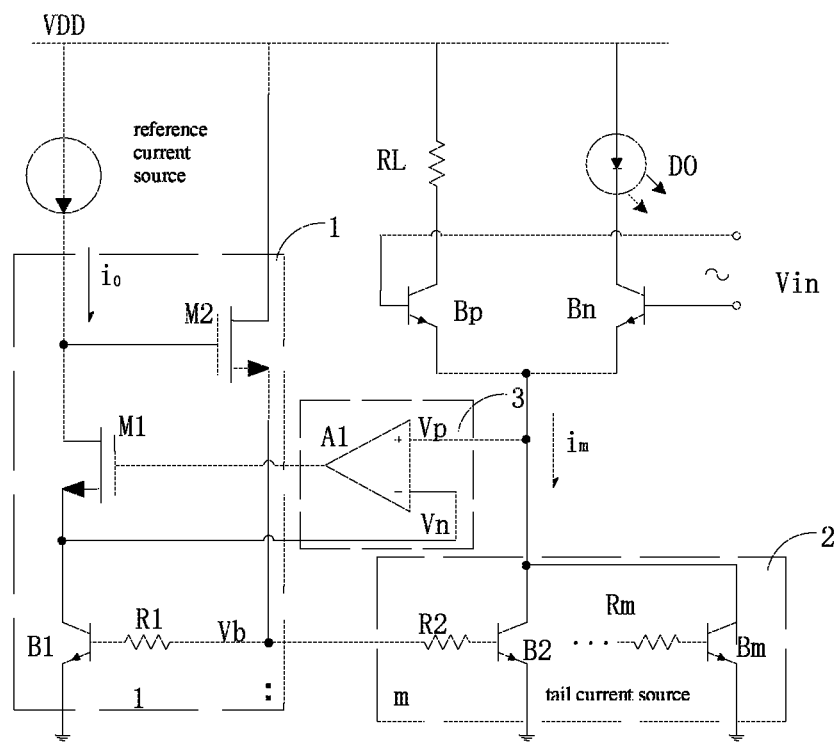
FIG. 3 is a circuit diagram of an accurate current mirror circuit in a low voltage headroom applied to a laser driver according to this invention.

As shown in FIG. 3, an accurate current mirror circuit in a low voltage headroom applied to a laser driver includes a reference current detection unit 1, a tail current source unit 2, and a control unit 3; the reference current detection unit 1 is coupled with a reference current source, and the reference current detection unit 1 is configured to receive a reference current $i_0$ of the reference current source and generate a bias voltage Vb and a reference voltage Vn according to the reference current; the tail current source unit 2 is coupled with the reference current detection unit 1, and the tail current source unit 2 is configured to receive the bias voltage Vb and generate a mirror current $i_m$ according to the bias voltage Vb; and the control unit 3 is coupled with the reference current detection unit 1 and the tail current source unit 2, and the control unit 3 is configured to receive the reference voltage Vn and an output voltage Vp corresponding to the mirror current and carry out a feedback regulation to the bias voltage Vb outputted by the reference current detection unit 1 according to the reference voltage Vn and the output voltage Vp corresponding to the mirror current.

The reference current detection unit 1 includes a first n-channel metal oxide semiconductor (NMOS) transistor M1, a first n-type, p-type, n-type (NPN) bipolar junction transistor B1, and a bias resistor R1. A drain of the first NMOS transistor M1 is coupled with the reference current source, a gate of the first NMOS transistor M1 is coupled with an output end of the control unit, and a source of the first NMOS transistor M1 is coupled with a collector of the first NPN bipolar junction transistor B1. A base of the first NPN bipolar junction transistor B1 is coupled with one end of the bias resistor R1, and an emitter of the first NPN bipolar junction transistor B1 is grounded. The other end of the bias resistor R1 is coupled with the tail current source unit. The first NMOS transistor M1, the first NPN bipolar junction transistor B1, and the bias resistor R1 form a negative feedback loop to ensure the stability of the loop.

In addition, the reference current detection unit 1 further includes a second NMOS transistor M2. A drain of the second NMOS transistor M2 is coupled with a power supply voltage VDD, a gate of the second NMOS transistor M2 is coupled with the drain of the first NMOS transistor M1, and a source of the second NMOS transistor M2 is coupled with a connection node of the reference current detection unit 1 and the control unit 3. The second NMOS transistor M2 is configured to supply a base current for the first NPN bipolar junction transistor B1.

The tail current source unit 2 includes a plurality of tail current source modules, and each includes a feedback resistor and an NPN bipolar junction transistor. One end of the feedback resistor is coupled with an output end of the reference current detection unit and configured to receive the bias voltage, and the other end of the feedback resistor is coupled with a base of the NPN bipolar junction transistor. A collector of the NPN bipolar junction transistor is coupled with an input end of the control unit, and an emitter of the NPN bipolar junction transistor is grounded. In this embodiment, R2 and B2 in the figure are corresponding feedback resistor and NPN resistor in one group. Therefore, the tail current source unit includes feedback resistors R2~Rm and NPN triodes B2~Bm corresponding to the feedback resistors. A plurality of tail current source modules work together to generate a mirror current $i_m$ corresponding to the bias voltage Vb outputted by the reference current detecting unit. In addition, the bias resistor R1 and the feedback resistors R2~Rm are of the same type, NPN transistors B1~Bm are of the same type, and feedback resistors R2~Rm and the bias resistor R1 in the reference current detection unit are configured to reduce a mismatch problem of the NPN transistor B1 and NPN transistors B2~Bm.

The control unit 3 includes an error amplifier A1, and the error amplifier A1 includes two input ends and one output end. One of the input ends is coupled with an output end of the tail current source unit 2, the other input end is coupled with a connection node of the first NMOS transistor and the first NPN triode, and the output end is coupled with the gate of the first NMOS transistor. As both two input ends of the error amplifier A1 are coupled with the gates of the MOS transistors, there is no current closed circuit.

The error amplifier A1 locks a collector voltage Vn of the first NPN triode B1 at the same potential as a collector voltage Vp of NPN triodes B2~Bm, thus ensuring that three ends of the first NPN triode B1 have the same level as NPN triodes B2~Bm. In this embodiment, as a current mirror unit of the first NPN triode B1 and a current mirror unit of the NPN triodes B2~Bm have a relationship of 1:m−1, an accurate mirror current $i_m=(m-1)\cdot i_0$ is generated at the output end of the tail current source unit.

Since the voltage of the reference voltage Vn and the output voltage Vp does not change significantly with the reference current $i_0$ and the mirror current $i_m$, even if the reference current $i_0$ is very small, the reference voltage Vn and the output voltage Vp remain at about 0.3V, and the influence of an offset voltage of the error amplifier A1 on the accuracy of the mirror current can be ignored.

In this invention, the bias voltage is generated through the feedback regulation of the reference voltage Vn and the output voltage Vp, and then the bias voltage is mirrored to generate the mirror current outputted to the laser, thus avoiding the problem of inaccurate current output caused by the offset of the control unit in the low voltage headroom.

The specific embodiments described above further explain objectives, technical solutions, and beneficial effects of this invention, and it is understood that the above-mentioned description is only the embodiment of this invention and is not intended to limit the protection scope of this invention. It should be noted that for those skilled in the art, any made modifications, equivalent replacement, improvements, etc. within the spirit and principle of this invention are intended to be included in the protection scope of this invention.

What is claimed is:

1. An accurate current mirror circuit in a low voltage headroom applied to a laser driver, comprising a reference current detection unit, a tail current source unit, and a control unit;

the reference current detection unit, coupled with a reference current source, and configured to receive a reference current of the reference current source and generate a bias voltage and a reference voltage according to the reference current;

the tail current source unit, coupled with the reference current detection unit, and configured to receive the bias voltage and generate a mirror current according to the bias voltage; and the control unit, coupled with the reference current detection unit and the tail current source unit, and configured to receive the reference voltage and an output voltage corresponding to the mirror current and carry out a feedback regulation to the bias voltage outputted by the reference current detection unit according to the reference voltage and the output voltage corresponding to the mirror current, wherein the reference current detection unit comprises a first n-channel metal oxide semiconductor (NMOS) transistor, a first NPN bipolar junction transistor, and a bias resistor, a drain of the first NMOS transistor is coupled with the reference current source, a gate of the first NMOS transistor is coupled with an output end of the control unit, a source of the first NMOS transistor is coupled with a collector of the first NPN bipolar junction transistor, a base of the first NPN bipolar junction transistor is coupled with one end of the bias resistor, an emitter of the first NPN bipolar junction transistor is grounded, and the other end of the bias resistor is coupled with the tail current source unit.

2. The accurate current mirror circuit in the low voltage headroom applied to the laser driver according to claim 1, wherein the tail current source unit comprises a plurality of tail current source modules, each comprises a feedback resistor and a bipolar junction transistor, one end of the feedback resistor is coupled with an output end of the reference current detection unit and configured to receive the bias voltage, the other end of the feedback resistor is coupled with a base of the NPN bipolar junction transistor, a collector of the NPN bipolar junction transistor is coupled with an input end of the control unit, and an emitter of the NPN bipolar junction transistor is grounded.

3. The accurate current mirror circuit in the low voltage headroom applied to the laser driver according to claim 1, wherein the reference current detection unit further comprises a second NMOS transistor, a drain of the second NMOS transistor is coupled with a power supply voltage, a gate of the second NMOS transistor is coupled with the drain of the first NMOS transistor, and a source of the second NMOS transistor is coupled with a connection node of the reference current detection unit and the control unit.

4. The accurate current mirror circuit in the low voltage headroom applied to the laser driver according to claim 1, wherein the control unit comprises an error amplifier, the error amplifier comprises two input ends and one output end, one of the input ends is coupled with an output end of the tail current source unit, the other input end is coupled with a connection node of the first NMOS transistor and the first NPN bipolar junction transistor, and the output end is coupled with the gate of the first NMOS transistor.

5. The accurate current mirror circuit in the low voltage headroom applied to the laser driver according to claim 1, wherein the reference current detection unit comprises a bias resistor, the tail current source comprises a plurality of feedback resistors, and the bias resistor and the feedback resistors are of the same type.

\* \* \* \* \*